United States Patent
Nishihori et al.

(10) Patent No.: US 9,768,268 B2
(45) Date of Patent: Sep. 19, 2017

(54) SEMICONDUCTOR DEVICE

(71) Applicant: Kabushiki Kaisha Toshiba, Minato-ku, Tokyo (JP)

(72) Inventors: Kazuya Nishihori, Shibuya Tokyo (JP); Takahiro Nakagawa, Kawasaki Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 27 days.

(21) Appl. No.: 14/826,371

(22) Filed: Aug. 14, 2015

(65) Prior Publication Data

US 2016/0204213 A1 Jul. 14, 2016

(30) Foreign Application Priority Data

Jan. 14, 2015 (JP) ................................. 2015-005357

(51) Int. Cl.
*H03K 17/00* (2006.01)
*H01L 29/423* (2006.01)
(Continued)

(52) U.S. Cl.
CPC .... *H01L 29/42368* (2013.01); *H01L 29/0649* (2013.01); *H01L 29/0684* (2013.01);
(Continued)

(58) Field of Classification Search
CPC ............................................... H01L 29/42368
(Continued)

(56) References Cited

U.S. PATENT DOCUMENTS 6,204,138 B1 * 3/2001 Krishnan .......... H01L 29/78612
257/E29.278
6,680,504 B2 * 1/2004 Howard ............ H01L 29/66651
257/300
(Continued)

FOREIGN PATENT DOCUMENTS

JP 2000-049346 A 2/2000
JP 2000-058818 A 2/2000
(Continued)

OTHER PUBLICATIONS

T.Y. Chan et al., "The Impact of Gate-Induced Drain Leakage Current on MOSFET Scaling," 1987 IEDM Technical Digest, pp. 718-721.

*Primary Examiner* — Lincoln Donovan
*Assistant Examiner* — Metasebia Retebo
(74) *Attorney, Agent, or Firm* — White & Case LLP

(57) ABSTRACT

A semiconductor device according to an embodiment switches high-frequency signals and includes a semiconductor layer of a first conductivity type. A first layer of a second conductivity type is provided in the semiconductor layer. A second layer of the second conductivity type is provided in the semiconductor layer. A gate dielectric film is provided on the semiconductor layer, the first layer and the second layer. A gate electrode is provided on the gate dielectric film. The gate dielectric film includes a first portion and the semiconductor layer, and a second portion located at both side of the first portion-in a gate length direction of the gate electrode and being thicker than the first portion. At least a part of the second portion is located between the gate electrode and the first layer and between the gate electrode and the second layer.

13 Claims, 5 Drawing Sheets

(51) Int. Cl.
     *H01L 29/06*         (2006.01)
     *H01L 29/78*         (2006.01)
     *H03K 17/06*        (2006.01)
     *H01L 29/49*         (2006.01)
     *H01L 29/66*         (2006.01)

(52) U.S. Cl.
     CPC .... *H01L 29/42376* (2013.01); *H01L 29/4983* (2013.01); *H01L 29/6656* (2013.01); *H01L 29/78* (2013.01); *H01L 29/7833* (2013.01); *H03K 17/063* (2013.01)

(58) Field of Classification Search
     USPC ........................................................ 327/404
     See application file for complete search history.

(56) References Cited

U.S. PATENT DOCUMENTS

| | | |
|---|---|---|
| 8,487,688 B2 | 7/2013 | Seshita |
| 2011/0001543 A1 | 1/2011 | Kondo et al. |
| 2012/0132977 A1* | 5/2012 | Seshita .................... H03K 3/02 |
| | | 257/316 |

FOREIGN PATENT DOCUMENTS

| | | |
|---|---|---|
| JP | 2011-015289 A | 1/2011 |
| JP | 2012-119763 A | 6/2012 |
| JP | 5512498 B2 | 6/2014 |

\* cited by examiner

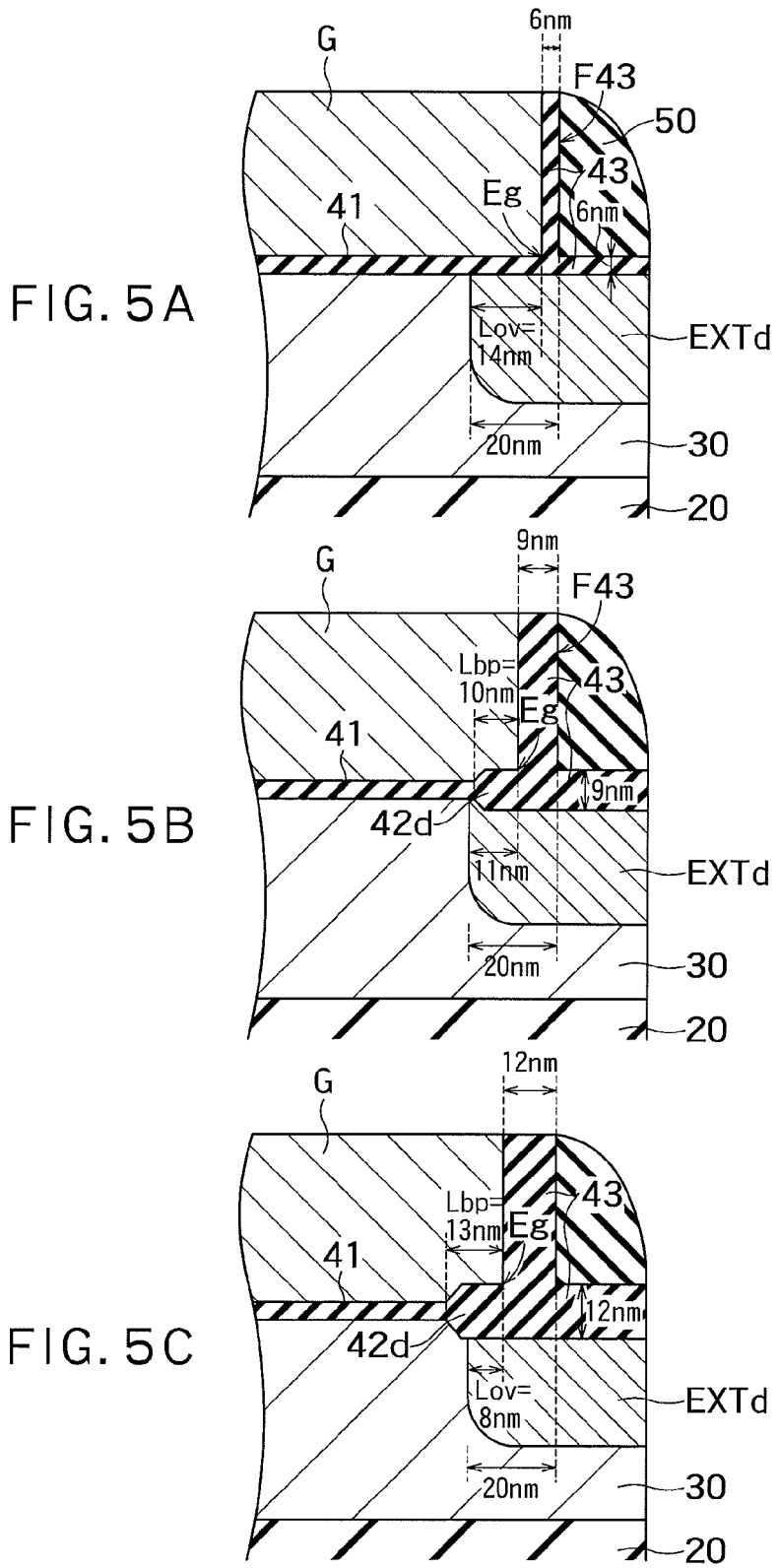

SEMICONDUCTOR DEVICE

CROSS REFERENCE TO RELATED APPLICATIONS

This application is based upon and claims the benefit of priority from the prior Japanese Patent Application No. 2015-005357, filed on Jan. 14, 2015, the entire contents of which are incorporated herein by reference.

FIELD

The embodiments of the present invention relate to a semiconductor device.

BACKGROUND

An electronic device such as a mobile device includes a high-frequency circuit that connects a transmission circuit or a reception circuit to an antenna. The high-frequency circuit has a high-frequency switching circuit to selectively connect the transmission circuit or the reception circuit to the antenna. A HEMT (High Electron Mobility Transistor) using GaAs is frequently used for switching elements of the high-frequency switching circuit. However, to enhance the function of the switching circuit and reduce the price thereof, application of a MISFET (Metal Insulator Semiconductor Field Effect Transistor) using Si is examined in recent years.

It is preferable that the switching elements of the high-frequency switching circuit pass high-frequency signals to the antenna without degrading the signals. That is, insertion losses of the high-frequency signals are preferably smaller. To reduce the insertion losses of the high-frequency signals, it is important to lower on-resistances of the switching elements. To lower the on-resistances of the switching elements, not only a channel length (a gate length) needs to be shortened but also a gate dielectric film needs to be thinned.

However, when the gate dielectric film is thinned, an electric field concentrates on a drain extension layer located just under a gate electrode due to a voltage difference between a gate and a drain and GIDL (Gate-Induced Drain Leakage) is likely to occur when the switching element is in an off-state. Because an off-state breakdown voltage of the switching element is thus lowered, the voltage difference between the gate and the drain at the time when the switching element is in an off-state needs to be reduced. This means that input power (allowable input power) of the high-frequency switching circuit needs to be reduced.

As described above, when the MISFET is applied to the switching elements of the high-frequency switching circuit and the film thickness of the gate dielectric film is reduced to reduce the insertion losses of the high-frequency signals, the off-state breakdown voltage is lowered due to the GIDL. This causes a problem that allowable input power of the high-frequency switching circuit cannot be maintained.

BRIEF DESCRIPTION OF THE DRAWINGS

FIGS. 5A to 5C are cross-sectional views showing observation results of a gate end of the switching element T1, respectively.

DETAILED DESCRIPTION

Embodiments will now be explained with reference to the accompanying drawings. The present invention is not limited to the embodiments.

A semiconductor device according to an embodiment switches high-frequency signals and includes a semiconductor layer of a first conductivity type. A first layer of a second conductivity type is provided in the semiconductor layer. A second layer of the second conductivity type is provided in the semiconductor layer. A gate dielectric film is provided on the semiconductor layer, the first layer and the second layer. A gate electrode is provided on the gate dielectric film. The gate dielectric film includes a first portion and the semiconductor layer, and a second portion located at both side of the first portion-in a gate length direction of the gate electrode and being thicker than the first portion. At least a part of the second portion is located between the gate electrode and the first layer and between the gate electrode and the second layer.

Figure 1:
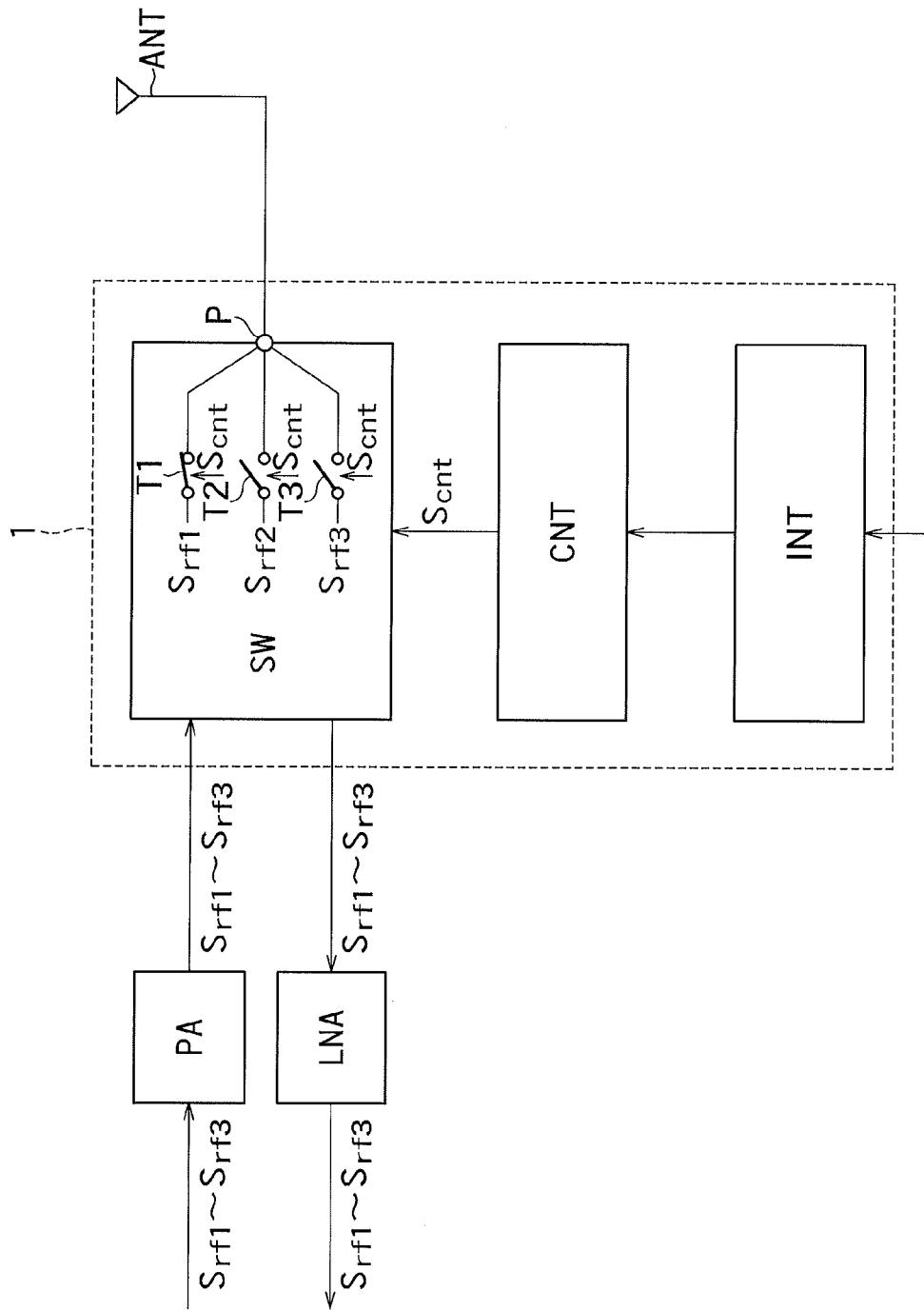
FIG. 1 is a block diagram showing a configuration example of an antenna switching device 1 according to an embodiment and peripheral parts thereof.

FIG. 1 is a block diagram showing a configuration example of an antenna switching device 1 according to an embodiment and peripheral parts thereof. The antenna switching device 1 includes a switching part SW, a controller CNT, and an interface part INT. The antenna switching device 1 can be a semiconductor integrated circuit device provided as one semiconductor chip on an SOI (Silicon On Insulator) substrate.

The interface part INT receives serial data to be used to generate a control signal Scnt as an input from an input terminal and converts the serial data to parallel data (a switching signal). For this purpose, the interface part INT has a serial/parallel conversion circuit and is constituted by a digital LSI (Large Scale Integration) that is highly integrated and that can perform a high-speed operation. Therefore, a MISFET used for the interface part INT has quite a small size (channel length and channel width) for high integration. The body of the MISFET is not connected to a reference voltage source for the purpose of high integration.

The controller CNT receives the parallel data (the switching signal) from the interface part INT and converts a voltage of the parallel data to a predetermined voltage to generate and output the control signal Scnt. The control signal Scnt is used to control switching elements of the switching part SW to be on/off. For this purpose, the controller CNT steps up the voltage of the parallel data to a sufficiently high voltage to turn on the switching elements, and generates the control signal Scnt. Therefore, a MISFET used for the controller CNT needs to have a sufficiently-high breakdown voltage to enable step-up of the parallel data to the control signal Scnt. The MISFET has a body electrode to obtain a high breakdown voltage and the body electrode is connected to a reference voltage source.

In the present embodiment, the switching part SW is an SPnT (Single Pole n Through (n=1, 2, 3, . . . ) antenna switching circuit. While the switching part SW has only three switching elements in FIG. 1, the switching part SW can have n switching elements and can switch among n types of high-frequency signals as described below.

The switching part SW includes an input/output port P and switching elements T1 to Tn connected to the input/output port P. That is, the switching elements T1 to Tn are connected between one antenna port P and n RF signal ports, respectively. The switching elements T1 to Tn are constituted by MISFETs, respectively. To obtain a high breakdown voltage, the body electrodes of the MISFETs are connected to the reference voltage source. While a shunt switch is provided between one end of each of the switching elements T1 to Tn and the reference voltage source, the shunt switch is not shown in FIG. 1.

The switching elements T1 to Tn receive high-frequency signals Srf1 to Srfn, respectively, and the control signal Scnt as inputs. The switching elements T1 to Tn are controlled to be on/off based on the control signal Scnt and connect the high-frequency signals Srf1 to Srfn to an antenna ANT or block the signals Srf1 to Srfn, respectively.

For example, when the switching element T1 becomes an on-state and the switching elements T2 to Tn are in an off-state, the switching element T1 connects the high-frequency signal Srf1 to the antenna ANT and the switching elements T2 to Tn block the high-frequency signals Srf2 to Srfn, respectively. When the switching element T2 becomes an on-state and the switching elements T1 and T3 to Tn are in an off-state, the switching element T2 connects the high-frequency signal Srf2 to the antenna ANT and the switching elements T1 and T3 to Tn block the high-frequency signals Srf1 and Srf3 to Srfn, respectively. The same hold true for other switching elements. In this way, the switching part SW can selectively connect the high-frequency signals Srf1 to Srfn to the antenna ANT based on the control signal Scnt. The switching elements T1 to Tn can be used for either transmission or reception. When used for transmission, the switching elements T1 to Tn receive the high-frequency signals Srf1 to Srfn from a transmission power amplifier PA and transmit the high-frequency signals Srf1 to Srfn to the antenna ANT, respectively. When used for reception, the switching elements T1 to Tn receive the high-frequency signals Srf1 to Srfn from the antenna ANT and transmit the high-frequency signals Srf1 to Srfn to a reception amplifier LNA (Low Noise Amplifier). The configuration of the MISFETs used for the switching elements T1 to Tn is explained later.

The transmission power amplifier PA amplifies power of high-frequency signals to desired power and outputs the resultant signals to the antenna switching device 1. The reception amplifier LNA amplifies power of high-frequency signals received by the antenna ANT.

The high-frequency signals Srf1 to Srfn can be high-frequency signals used in different communication systems (such as CDMA (Code Division Multiple Access) and GSM® (Global System for Mobile)), respectively.

Configurations of the switching elements T1 to Tn used in the switching part SW are explained next.

Figure 2:
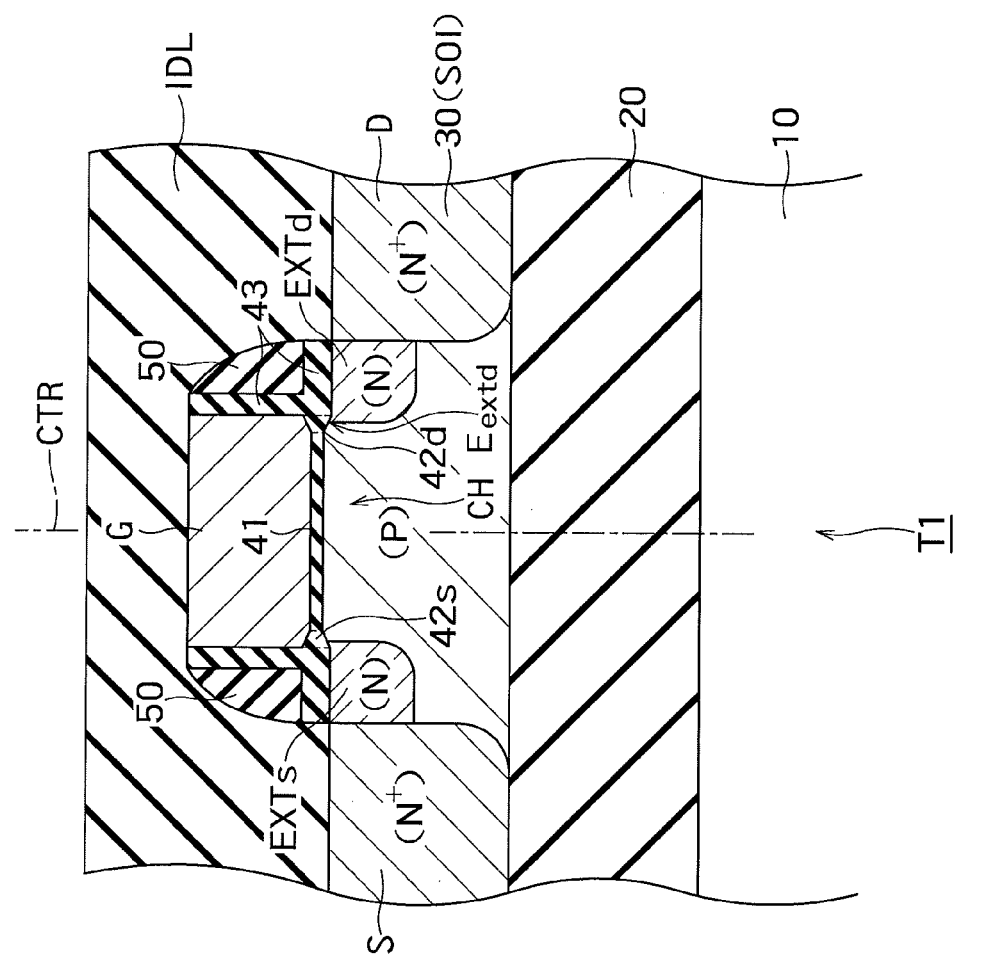
FIG. 2 is a cross-sectional view showing an example of a transistor that constitutes the switching element T1 according to the present embodiment.

FIG. 2 is a cross-sectional view showing an example of a transistor that constitutes the switching element T1 according to the present embodiment. The configurations of the switching elements T2 to Tn can be the same as that of the switching element T1 and thus explanations of the configuration of the switching elements T2 to Tn are omitted.

The switching element T1 includes a semiconductor layer 30, a drain layer D, a source layer S, extension layers EXTd and EXTs, gate dielectric films (first and second portions) 41, 42d, and 42s, a gate electrode G, a sidewall dielectric film 43, and a spacer 50.

The switching element T1 is, for example, an N-type MISFET provided on an SOI substrate or an SOS (Silicon On Sapphire) substrate. In the present embodiment, it is assumed that the switching element T1 is provided on an SOI substrate as an example. The SOI substrate includes a support substrate 10, a BOX (Buried Oxide) layer 20, and an SOI layer 30. The switching element T1 is formed on the SOI layer 30 serving as the semiconductor layer.

The SOI layer 30 is, for example, single-crystal silicon and is a semiconductor layer containing P-type impurities.

The extension layer EXTd serving as a first layer is an N-type impurity diffusion layer provided in the SOI layer 30. The extension layer EXTd is provided in a portion of the SOI layer 30 on a drain side of the gate electrode G and is adjacent to the drain layer D. The extension layer EXTd is provided in a surface area of the SOI layer 30 and is not provided to reach a bottom portion of the SOI layer 30. However, it is permissible to form the extension layer EXTd deeply to some extent to reduce the on-resistance.

The extension layer EXTs serving as a second layer is an N-type impurity diffusion layer provided in the SOI layer 30. The extension layer EXTs is provided in a portion of the SOI layer 30 on a source side of the gate electrode G and is adjacent to the source layer S. The extension layer EXTs is provided in a surface area of the SOI layer 30 and is not provided to reach the bottom portion of the SOI layer 30. However, it is permissible to form the extension layer EXTs deeply to some extent to reduce the on-resistance.

When the extension layers EXTd and EXTs are formed deeply, occurrence of a short-channel effect becomes a concern. However, because the switching element T1 used for switching of high-frequency signals generally operates in a linear region, the short-channel effect poses little problem as compared to a transistor used for a digital circuit that operates in a saturation region.

The drain layer D serving as a third layer is adjacent to the extension layer EXTd and is an N-type impurity diffusion layer similarly to the extension layers EXTd and EXTs. The drain layer D is provided from the top surface of the SOI layer 30 to the bottom surface thereof.

The source layer S serving as a fourth layer is adjacent to the extension layer EXTs and is an N-type impurity diffusion layer similarly to the extension layers EXTs and EXTd and the drain layer D. The source layer S is provided from the top surface of the SOI layer 30 to the bottom surface thereof.

Because the drain layer D and the source layer S are provided from the top surface of the SOI layer 30 to the bottom surface thereof, a depletion layer extending from the drain layer D or the source layer S can be restricted and an off-capacitance can be reduced. When the off-capacitance of the switching element T1 is reduced, the switching element T1 can increase the impedance to a high-frequency signal in an off-state and suppress passage of the high-frequency signal more reliably.

A channel region CH of the switching element T1 is formed in the surface of a portion (a body portion) of the SOI layer 30 between the extension layer EXTd and the extension layer EXTs. The body portion of the switching element T1 is connected to a reference voltage source to obtain a high breakdown voltage.

The first gate dielectric film (first portion) 41 and the second gate dielectric films (second portions) 42d and 42s are provided on the SOI layer 30 between the extension layer EXTd and the extension layer EXTs. The first portion 41 and the second portions 42d and 42s can be, for example, a silicon dioxide film or an insulating film having a higher relative permittivity than that of the silicon dioxide film.

The gate electrode G is provided on the first portion 41 and the second portions 42d and 42s. The gate electrode G is, for example, doped polysilicon.

The first portion 41 is provided between a central portion of the gate electrode G and the SOI layer 30. The second portions 42d and 42s are provided between end portions of the gate electrode G and the SOI layer 30, respectively. The second portions 42d and 42s are provided are located at both side of the first portion in a gate length direction of the gate electrode G. The gate length direction is a direction from the drain layer D to the source layer S or from the source layer S to the drain layer D. The second portions 42d and 42s have film thicknesses larger than that of the first portion 41. The second portions 42d and 42s have a bird's beak shape and the thicknesses of the second portions 42d and 42s are reduced from opposite sides of the gate electrode G toward the first portion 41, respectively. For example, when a gate length of the switching element T1 is about 100 nanometers to 300 nanometers and a film thickness of the SOI layer 30 is about 200 nanometers, a film thickness (EOT (Equivalent Oxide Thickness)) of the first portion 41 is about 6 nanometers or smaller and film thicknesses (EOTs) of the second portions 42d and 42s are about 6 nanometers to 12 nanometers.

An end Eextd of the extension layer EXTd on the drain side is located below the gate electrode G and is located below the second portion 42d. That is, when viewed from above the semiconductor layer 30, the extension layer EXTd overlaps with the gate electrode G. However, the extension layer EXTd does not extend to the central portion of the gate electrode G and overlaps with an end of the gate electrode G. Therefore, the end Eextd of the extension layer EXTd is located on a side nearer the drain than a boundary between the first portion 41 and the second portion 42d and is located on a side nearer the source than the gate electrode end. Accordingly, the end Eextd of the extension layer EXTd is provided in contact with the second portion 42d. Alternatively, the end Eextd can be located just under the boundary between the first portion 41 and the second portion 42d. That is, the end Eextd can be provided in contact with the boundary between the first portion 41 and the second portion 42d.

In a gate length direction of the switching element T1, a length (Lov in FIG. 5) from a position in the extension layer EXTd just below the end of the gate electrode G to the end Eextd of the extension layer EXTd is equal to or smaller than a length (Lbp in FIG. 5) of the second portion 42d.

As described above, in the present embodiment, the film thickness of the second portion 42d is larger than that of the first portion 41 and the end Eextd of the extension layer EXTd is located under the second portion 42d.

When the second portion 42d has a film thickness substantially equal to that of the first portion 41 or the extension layer EXTd extends to a position below the central portion of the gate electrode G (the first portion 41), a relatively large electric field caused by a voltage difference between the gate and the drain concentrates on the extension layer EXTd when the switching element T1 is in an off-state. Accordingly, a surface potential in a vertical direction (a longitudinal direction) increases, which causes a tunneling current in an area of the extension layer EXTd below the gate electrode G. This leads to occurrence of the GIDL and lowers the off-state breakdown voltage of the switching element T1 as described above.

In contrast thereto, according to the present embodiment, the second portion 42d thicker than the first portion 41 is interposed between the extension layer EXTd and the end of the gate electrode G. This relaxes concentration of an electric field caused by a voltage difference between the gate and the drain on the extension layer EXTd and suppresses occurrence of the GIDL when the switching element T1 is in an off-state. Therefore, the off-state breakdown voltage of the switching element T1 between the gate and the drain can be increased. As a result, a drain voltage at the time when the switching element T1 is in an off-state can be increased and thus the allowable input power can be increased.

On the other hand, when the second portions 42d and 42s are thick at the ends of the gate electrode G, it is considered that the on-resistance of the switching element T1 is increased to some extent. However, the second portions 42d and 42s are provided only at parts of the ends of the gate electrode G (only at both side of the first portion in a gate length direction of the gate electrode G) and the increase in the on-resistance is limited. Furthermore, in the present embodiment, it is possible to set the film thickness of the first portion 41 sufficiently small while suppressing the GIDL by increasing the film thicknesses of the second portions 42d and 42s. Therefore, by considering the thinness of the first portion 41, the on-resistance of the switching element T1 can be conversely lowered. Of course, because the on-resistance is increased when the film thicknesses of the second portions 42d and 42s are too large, the film thicknesses of the second portions 42d and 42s have a suitable range. The suitable range of the film thicknesses of the second portions 42d and 42s is explained later.

According to the present embodiment, the switching element T1 is formed on the SOI substrate or the SOS substrate. The source layer S and the drain layer D are formed from the top surface of the SOI layer 30 to reach the BOX layer 20. Accordingly, the off-capacitance can be reduced as described above. By reducing the off-capacitance of the switching element T1, the switching element T1 can increase the impedance to the high-frequency signal and suppress passage of the high-frequency signal more reliably when it is in an off-state.

A switching element for an antenna requires that the insertion loss of the high-frequency signal is small (the on-resistance is low), the off-state breakdown voltage is high (having high allowance input power), and that the off-capacitance is small (the impedance to the high-frequency signal in an off-state is high). As described above, the present embodiment can meet these requirements and can overcome the trade-off of these requirements.

A transistor applied to the digital LSI is used in the saturation region. Because a drain voltage in the saturation region is higher than that in the linear region, the short-channel effect needs to be considered sufficiently. To suppress the short-channel effect, the extension layer on the drain side needs to be formed more shallowly as the gate length of the transistor is set shorter. Meanwhile, the bird's beaks are generally formed together with the sidewall dielectric film in an oxidization process before the extension layer is formed (see FIG. 3C). In the oxidization process, an oxide film is formed together with the sidewall dielectric film on the SOI layer in an extension formation region. Therefore, when formation of the bird's beaks is attempted, the oxide film in the extension formation region is also formed thickly. In this case, it becomes difficult to form the extension layer shallowly and suppression of the short-channel effect becomes difficult. Therefore, it is undesirable to provide the bird's beaks in the transistor for a digital LSI in which the extension layer needs to be shallow (thin).

In contrast thereto, because the switching element T1 according to the present embodiment is used for switching of high-frequency waves and operates in the linear region, the short-channel effect is relatively less problematic. Therefore, the switching element T1 can have the bird's beaks at the ends of the gate dielectric film. There is thus no problem even when the extension layers EXTd and EXTs are formed relatively deeply. Instead, it can be said that the extension layers EXTd and EXTs are preferably formed deeply to some extent to reduce the on-resistance.

The extension layers EXTd and EXTs can be provided on entire portions of the surface of the SOI layer 30 located under the second portions 42d and 42s, respectively. That is, the end Eextd of the extension layer EXTd can extend to a position just under the boundary between the first portion 41 and the second portion 42d. An end Eexts of the extension layer EXTs can extend to a position just under a boundary between the first portion 41 and the second portion 42s. Accordingly, the off-state breakdown voltage of the switching element T1 can be increased and also the on-resistance can be further reduced.

When a diffusion layer to which a relatively high voltage is applied is used as the drain, the source and the drain are switched with each other at a high frequency depending on the sign of the voltage applied to between the source and the drain because the switching element T1 performs switching of the high-frequency signal. Therefore, it is preferable that the switching element T1 is symmetrical (bilaterally symmetrical) on the source side and the drain side with respect to a central line CTR in FIG. 2. That is, it is preferable that the source layer S and the drain layer D are in a symmetrical relation, the extension layers EXTd and EXTs are in a symmetrical relation, and the second portions 42s and 42d are in a symmetrical relation.

A manufacturing method of the switching element T1 according to the present embodiment is explained next.

FIGS. 3A to 4B are cross-sectional views showing an example of the manufacturing method of the switching element T1 according to the present embodiment.

First, the first portion 41 is formed on the SOI layer 30 which is a part of the SOI substrate. The first portion 41 is, for example, a silicon dioxide film and is formed by thermally oxidizing the top surface of the SOI layer 30. The film thickness of the first portion 41 is, for example, about 6 nanometers.

Figure 3A:
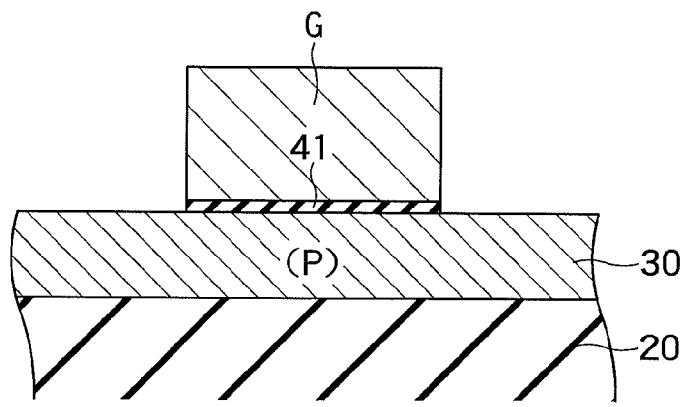
FIGS. 3A to 4B are cross-sectional views showing an example of the manufacturing method of the switching element T1 according to the present embodiment.

Next, a material of the gate electrode G is deposited on the first portion 41. The material of the gate electrode G is, for example, doped polysilicon. Subsequently, the material of the gate electrode G is processed in a pattern of the gate electrode G using a lithography technique and an etching technique. The gate electrode G is thereby formed as shown in FIG. 3A. The gate length of the gate electrode G is, for example, about 100 nanometers to about 300 nanometers. The first portion 41 is etched together with the gate electrode G into the same pattern as that of the gate electrode G.

Figure 3B:
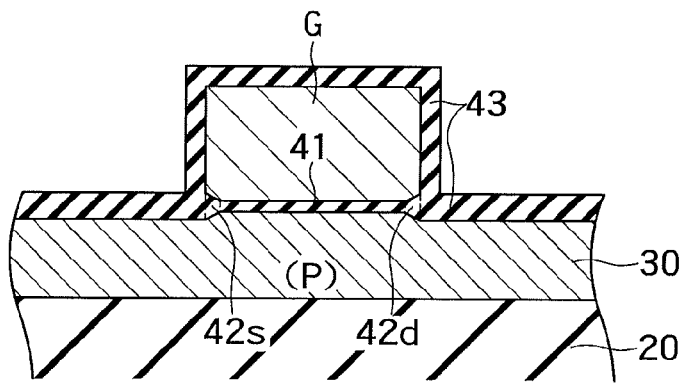

Next, the sidewall dielectric film 43 is formed on the top surface of the gate electrode G, the side surfaces of the gate electrode G, and the top surface of the SOI layer 30. At that time, oxygen enters from the ends of the gate electrode G (the ends of the first portion 41) and the ends of the first portion 41 become thicker. Accordingly, the ends of the first portion 41 are formed in the bird's beak shape as shown in FIG. 3B. Portions of the gate dielectric film at the ends of the first portion 41, which are formed more thickly than a central portion of the first portion 41, are regarded as the second portions 42d and 42s, respectively. The film thicknesses of the second portions 42d and 42s are, for example, about 6 nanometers to about 12 nanometers.

Figure 3C:
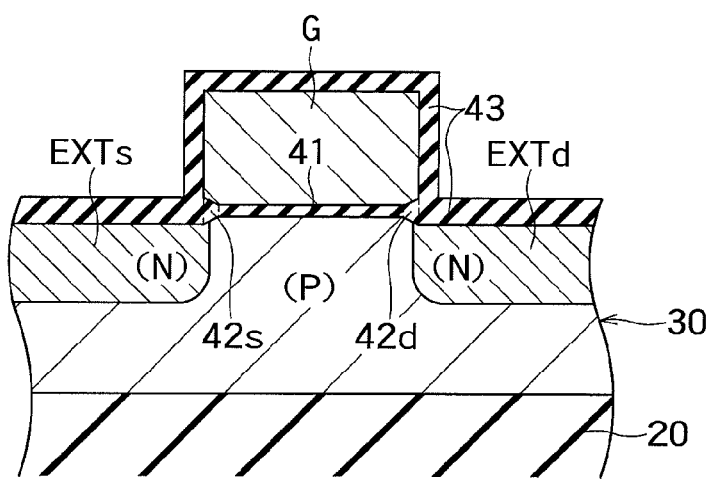

Next, ions of N-type impurities (phosphorous or arsenic) are implanted using the gate electrode G as a mask. At that time, the impurity ions pass through the sidewall dielectric film 43 on the SOI layer 30 and are implanted to the top surface of the SOI layer 30. By activating the impurities, the extension layers EXTd and EXTs are formed in a self-aligned manner as shown in FIG. 3C.

Figure 4A:
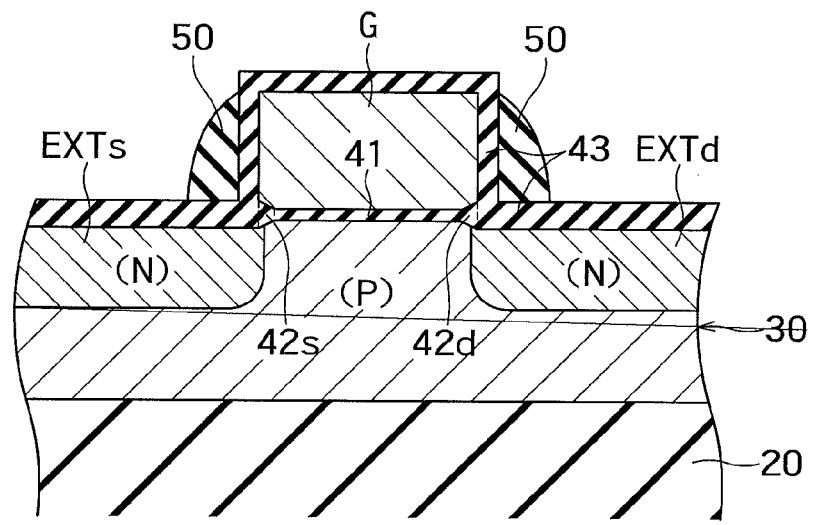

Subsequently, a material of the spacer 50 is deposited on the sidewall dielectric film 43. Next, the material of the spacer 50 is etched back to form the spacer 50 on the side surfaces of the gate electrode G with the sidewall dielectric film 43 interposed therebetween as shown in FIG. 4A.

Figure 4B:
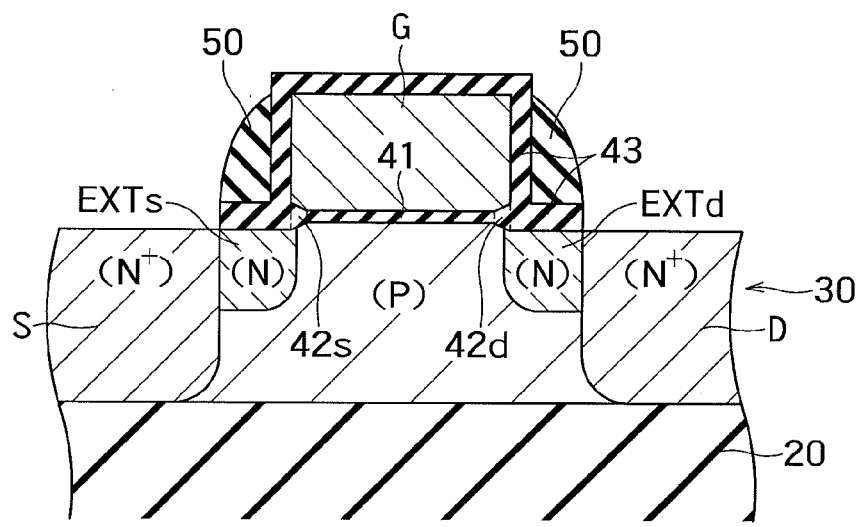

Subsequently, ions of N-type impurities are implanted using the gate electrode G and the spacer 50 as a mask. By activating the impurities, the drain layer D and the source layer S are formed as shown in FIG. 4B.

Thereafter, an interlayer dielectric film IDL, contacts, a wiring layer, and the like are formed, whereby the switching element T1 according to the present embodiment is completed.

The thickness of the second portion 42d is examined next.

FIGS. 5A to 5C are cross-sectional views showing observation results of a gate end of the switching element T1, respectively. In FIGS. 5A to 5C, the respective thicknesses of the second portions 42d differ. For example, the thickness of the second portion 42d shown in FIG. 5A is about 6 nanometers, the thickness of the second portion 42d shown in FIG. 5B is about 9 nanometers, and the thickness of the second portion 42d shown in FIG. 5C is about 12 nanometers.

In this case, the film thickness of the first portion 41 is equal to or smaller than about 6 nanometers. A diffusion distance of the extension layer EXTd (a distance from a side surface F43 of the sidewall dielectric film 43 to the end Eextd of the extension layer EXTd) is about 20 nanometers. A distance from an end Eg of the gate electrode G to the end Eextd of the extension layer EXTd (a length of the extension layer EXTd facing the bottom surface of the gate electrode G in the channel length direction) is assumed as an overlap length Lov. In this case, the overlap length Lov is about 14 nanometers (20 nanometers−6 nanometers) in FIG. 5A, about 11 nanometers (20 nanometers−9 nanometers) in FIG. 5B, and about 8 nanometers (20 nanometers−12 nanometers) in FIG. 5C.

Assuming that the length of the bird's beak (the length of the second portion 42d in the channel length direction) is denoted by Lbp, the bird's beak length Lbp was about 0 nanometer when the film thickness of the first portion 41 was about 6 nanometers as shown in FIG. 5A. When the film thickness of the first portion 41 was about 9 nanometers, the bird's beak length Lbp was about 10 nanometers as shown in FIG. 5B. When the film thickness of the first portion 41 was about 12 nanometers, the bird's beak length Lbp was about 13 nanometers as shown in FIG. 5C.

When the film thickness of the second portion 42d is substantially equal to that of the first portion 41 as shown in FIG. 5A, the bird's beak is hardly formed at the ends of the first portion 41. In this case, while the on-resistance of the switching element T1 is reduced, the GIDL occurs and thus there is a risk of a decrease in the on-state breakdown voltage and a decrease in the allowance input power.

When the film thickness of the second portion 42d is larger than that of the first portion 41 and the bird's beak length Lbp is substantially equal to the overlap length Lov (about 10 nanometers to about 11 nanometers) as shown in FIG. 5B, it is possible to suppress occurrence of the GIDL and keep the on-state breakdown voltage high. Therefore, the allowance input power also can be maintained high. The overlap length Lov is preferably equal to or smaller than the bird's beak length Lbp to suppress the GIDL. However, the overlap length Lov can be somewhat larger than the bird's beak length Lbp as shown in FIG. 5B. This is because the GIDL can be suppressed even in this case. The extension layer EXTd is located at an entire portion below the second portion 42d and there is almost no channel region CH under the second portion 42d. Therefore, an increase in the on-resistance can be effectively suppressed. That is, by setting Lbp and Lov to be substantially equal, maintenance of the allowance input power and suppression of the on-resistance increase can be both realized.

When the film thickness of the second portion 42d is quite larger than that of the first portion 41 and the bird's beak length Lbp is larger than the overlap length Lov as shown in FIG. 5C, occurrence of the GIDL can be suppressed and the on-state breakdown voltage can be maintained high. Therefore, the allowance input power can be also maintained high. On the other hand, when the bird's beak length Lbp is too long, the length of the channel region CH located below the second portion 42d becomes too long. This leads to an increase in the on-resistance.

Accordingly, while depending on the configuration of the switching element T1, the length of the second portion 42d in the channel length direction (that is, the bird's beak length Lbp and the thickness of the sidewall dielectric film 43) has an appropriate range. In the specific example described above, the bird's beak length Lbp is preferably in a range from about 6 nanometers to about 12 nanometers. The switching element T1 used for the antennal switching device 1 generally has a gate length of about 100 nanometers to 300 nanometers and a film thickness (EDT) of the first portion 41, being equal to or smaller than about 6 nanometers. Accordingly, it can be said that the existing switching element T1 preferably has film thicknesses (EOTs) of the second portions 42d and 42s, being about 6 nanometers to 12 nanometers.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device switching high-frequency signals, the device comprising:
a semiconductor layer of a first conductivity type;
a first layer of a second conductivity type in the semiconductor layer;
a second layer of the second conductivity type in the semiconductor layer;
a gate dielectric film on the semiconductor layer, the first layer and the second layer; and
a gate electrode on the gate dielectric film, wherein
the gate dielectric film comprises a first portion and a second portion located at both side of the first portion in a gate length direction of the gate electrode and being thicker than the first portion, at least a part of the second portion being located between the gate electrode and the first layer and between the gate electrode and the second layer, wherein
a length of the first layer from a position below one of the end parts of the gate electrode to an end part of the first layer in a gate length direction is smaller than a length of the second portion in a gate length direction.

2. The device of claim 1, wherein
the semiconductor layer is a part of an SOI (Silicon On Insulator) substrate or an SOS (Silicon On Sapphire) substrate,
the device further comprises:
a third layer of a second conductivity type adjacent to the first layer provided from a top surface of the semiconductor layer to a bottom surface thereof; and
a fourth layer of a second conductivity type adjacent to the second layer provided from the top surface of the semiconductor layer to the bottom surface thereof.

3. The device of claim 1, wherein the second conductivity type is N-type.

4. The device of claim 2, wherein the second conductivity type is N-type.

5. The device of claim 1, wherein the semiconductor layer between the first layer and the second layer is connected to a reference voltage source.

6. The device of claim 1, wherein an end part of the first layer is in contact with a boundary between the first portion and the second portion or is in contact with the second portion.

7. The device of claim 2, wherein an end part of the first layer is in contact with a boundary between the first portion and the second portion or is in contact with the second portion.

8. The device of claim 2, wherein a length of the first layer from a position below one of the end parts of the gate electrode to an end part of the first layer in a gate length direction is smaller than a length of the second portion in a gate length direction.

9. A semiconductor device comprising:
an interface part converting an input signal into a switching signal;
a controller converting a voltage of the switching signal and outputting a control signal; and
a switching part inputting or outputting one of high-frequency signals based on the control signal, wherein
the switching part comprises a plurality of switching elements, wherein
one of the switching elements comprises:
a semiconductor layer of a first conductivity type;
a first layer of a second conductivity type in the semiconductor layer;
a second layer of a second conductivity type in the semiconductor layer;
a gate dielectric film on the semiconductor layer, the first layer and the second layer; and
a gate electrode on the gate dielectric film, wherein
the gate dielectric film comprises a first portion extending along a direction of a gate width and a second portion located at both side of the first portion and being thicker than the first portion at least a part of the second portion being located between the gate electrode and the first layer and between the gate electrode and the second layer, wherein
a length of the first layer from a position below one of the end parts of the gate electrode to the end part of the first layer in a gate length direction is smaller than a length of the second portion in a gate length direction.

10. The device of claim 9, wherein the end part of the first layer is in contact with a boundary between the first portion and the second portion or is in contact with the second portion.

11. The device of claim 9, wherein
- the semiconductor layer is a part of an SOI (Silicon On Insulator) substrate or an SOS (Silicon On Sapphire) substrate,
- the device further comprises:
- a third layer of the second conductivity type adjacent to the first layer provided from a top surface of the semiconductor layer to a bottom surface thereof; and
- a fourth layer of the second conductivity type adjacent to the second layer provided from the top surface of the semiconductor layer to the bottom surface thereof.

12. The device of claim 9, wherein the first and second layers are N-type impurity diffusion layers, respectively.

13. The device of claim 9, wherein the semiconductor layer between the first layer and the second layer is connected to a reference voltage source.

\* \* \* \* \*